United States Patent
Sekizaki et al.

(10) Patent No.: US 8,552,729 B2
(45) Date of Patent: Oct. 8, 2013

(54) STATE MONITORING UNIT FOR ASSEMBLED BATTERY

(75) Inventors: Masashi Sekizaki, Makinohara (JP); Satoshi Ishikawa, Makinohara (JP); Kimihiro Matsuura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 474 days.

(21) Appl. No.: 12/861,870

(22) Filed: Aug. 24, 2010

(65) Prior Publication Data
US 2011/0050236 A1 Mar. 3, 2011

(30) Foreign Application Priority Data
Aug. 27, 2009 (JP) ................................. 2009-196515

(51) Int. Cl.
*G01R 31/36* (2006.01)
*H01J 7/00* (2006.01)

(52) U.S. Cl.
USPC ........... 324/426; 320/107; 320/112; 320/116; 320/125; 320/132

(58) Field of Classification Search
None
See application file for complete search history.

(56) References Cited

U.S. PATENT DOCUMENTS

| | | | | |
|---|---|---|---|---|
| 6,094,033 A | * | 7/2000 | Ding et al. | 320/132 |
| 6,653,817 B2 | * | 11/2003 | Tate et al. | 320/132 |
| 7,375,497 B2 | * | 5/2008 | Melichar | 320/132 |
| 7,911,178 B2 | | 3/2011 | Kawata et al. | |
| 8,030,940 B2 | * | 10/2011 | Nishimoto | 324/433 |
| 8,130,000 B2 | | 3/2012 | Botker et al. | |
| 8,193,763 B2 | | 6/2012 | Kawata et al. | |
| 2002/0171429 A1 | * | 11/2002 | Ochiai et al. | 324/426 |
| 2003/0128702 A1 | | 7/2003 | Satoh et al. | |
| 2005/0218900 A1 | * | 10/2005 | Iwabuchi et al. | 324/426 |
| 2006/0091861 A1 | * | 5/2006 | Melichar | 320/132 |
| 2006/0091863 A1 | * | 5/2006 | Melichar | 320/132 |
| 2007/0216367 A1 | * | 9/2007 | Coleman et al. | 320/132 |
| 2008/0219337 A1 | | 9/2008 | Kawata et al. | |
| 2008/0238432 A1 | | 10/2008 | Botker et al. | |
| 2011/0187326 A1 | | 8/2011 | Kawata et al. | |

FOREIGN PATENT DOCUMENTS

| | | |
|---|---|---|
| JP | 2000349768 A | 12/2000 |
| JP | 20039403 A | 1/2003 |
| JP | 2003-196230 A | 7/2003 |

(Continued)

OTHER PUBLICATIONS

Notification of Reasons for Refusal dated Jun. 18, 2013 from the Japanese Patent Office in counterpart Japanese application No. 2009-196515.

*Primary Examiner* — Yalkew Fantu
(74) *Attorney, Agent, or Firm* — Sughrue Mion, PLLC

(57) ABSTRACT

A state monitoring unit monitors a state of an assembled battery in which unit cells are connected in series. The state monitoring unit includes a plurality of voltage monitoring devices and a controller. The controller transmits a common voltage measurement command to the voltage monitoring devices connected in a daisy-chain scheme. Each of the voltage monitoring devices measures the voltage of the corresponding unit cells in response to the command that is received from the controller or the adjacent voltage monitoring device at a leading end of the communication channel, and transmits the command to the adjacent voltage monitoring device at a termination of the communication channel. When received the measured voltage from the adjacent voltage monitoring device at the termination, the voltage monitoring device transmits it with the own measured voltage. The controller determines the abnormality in reception state based on the number of received, measured voltages.

2 Claims, 5 Drawing Sheets

(56) References Cited

FOREIGN PATENT DOCUMENTS

| | | |
|---|---|---|
| JP | 2005123744 A | 5/2005 |
| JP | 2008220074 A | 9/2008 |
| JP | 200938857 A | 2/2009 |
| JP | 2010520733 A | 6/2010 |
| WO | 2008108979 A1 | 9/2008 |

* cited by examiner

STATE MONITORING UNIT FOR ASSEMBLED BATTERY

BACKGROUND OF THE INVENTION

1. Technical Field

The present invention relates to a unit for monitoring the state of an assembled battery which includes a plurality of unit cells connected in series in order to output a desired voltage.

2. Background Art

For example, a hybrid vehicle includes an assembled battery which acts as a motor driving power source. Such an assembled battery obtains a high voltage by connecting, in series, a plurality of unit cells of a secondary battery (storage battery) such as, for example, a nickel-hydrogen battery, a lithium battery or the like.

For such an assembled battery, there is a need to monitor a charging state of each unit cell in order to prevent each unit cell from being over-discharged or overcharged. The monitoring of the charging state of each unit cell requires the measurement of a voltage of each unit cell which is an indicator of the charging state.

Typically, a control system for an assembled battery includes a plurality of high voltage side controllers connected respectively to charging/discharging circuits of the assembled battery and a low voltage side controller electrically isolated from the plurality of high voltage side controllers. Each of the plurality of high voltage side controllers is provided to correspond to each unit cell and measures a voltage of each unit cell. The measured voltage of each unit cell is output to the low voltage side controller via a non-contact connector such as a photo coupler or the like. The low voltage side controller commands each high voltage side controller to measure the voltage of the unit cell and receives a measurement voltage of the unit cell measured by each high voltage side controller in response to the command. The measurement voltage of the unit cell received from each high voltage side controller is output, either as it is or after being subjected to a process, to a high level computer equipped within the vehicle.

As communication between the low voltage side controller and each high voltage side controller, a daisy chain scheme is mainly used which can easily cope with a change in the number of high voltage side controllers and has a high scalability. Taking the above-mentioned communication between the low voltage side controller and each high voltage side controller as an example, in the daisy chain communication, a protocol of a so-called master-slave scheme is commonly used in which the low voltage side controller corresponds to a master device and each high voltage side controller corresponds to a slave device (for example, see JP-A-2003-196230).

However, when data communication is performed between the low voltage side controller and each high voltage side controller, the amount of communication data increases with the increase of the number of high voltage side controllers, which is in proportion to the number of unit cells. In particular, in the communication using the above-mentioned master-slave scheme, since round-trip data communication is individually performed between the master device and each slave device, the amount of data communication becomes more remarkable when the number of high voltage side controllers increases.

The amount of data communicable per unit time between the low voltage side controller and each high voltage side controller is defined by the specification of a corresponding communication line. If the communication line used is a high speed communication line, a disadvantageous factor such as relative deterioration of noise resistance occurs and accordingly there is a desire to exchange measurement voltage data of unit cells between each high voltage controller and the low voltage controller without using such a high speed communication line.

As one measure to meet such a desire, it may be contemplated that the low voltage side controller issues a common command to instruct all of the high voltage side controllers to measure voltages of the unit cells. However, when each high voltage side controller outputs measurement voltage data of the unit cells to the low voltage side controller in response to the common command from the low voltage side controller, there is a need for the low voltage side controller to accurately detect that the measurement voltage data come out of the plurality of high voltage side controllers.

SUMMARY OF THE INVENTION

In consideration of the above circumstances, it is an object of the present invention to provide a state monitoring unit for an assembled battery, which allows a low voltage side controller to accurately detect that measurement voltage data come out of a plurality of high voltage side controllers even when the low voltage side controller issues a common command to instruct all of the high voltage side controllers to measure voltages of unit cells.

A state monitoring unit monitors a state of an assembled battery in which unit cells are connected in series. The state monitoring unit includes a plurality of voltage monitoring devices and a controller. The controller transmits a common voltage measurement command to the voltage monitoring devices connected in a daisy-chain scheme. Each of the voltage monitoring devices measures the voltage of the corresponding unit cells in response to the command that is received from the controller or the adjacent voltage monitoring device at a leading end of the communication channel, and transmits the command to the adjacent voltage monitoring device at a termination of the communication channel. When received the measured voltage from the adjacent voltage monitoring device at the termination, the voltage monitoring device transmits it with the own measured voltage. The controller determines the abnormality in reception state based on the number of received, measured voltages.

According to the state monitoring unit of the assembled battery of the present invention, it is possible to allow a low voltage side controller to accurately detect that the measurement voltage data come out of a plurality of high voltage side controllers even when the low voltage side controller issues a common command to instruct all of the high voltage side controllers to measure voltages of unit cells.

DETAILED DESCRIPTION OF THE EXEMPLARY EMBODIMENTS

Figure 1:
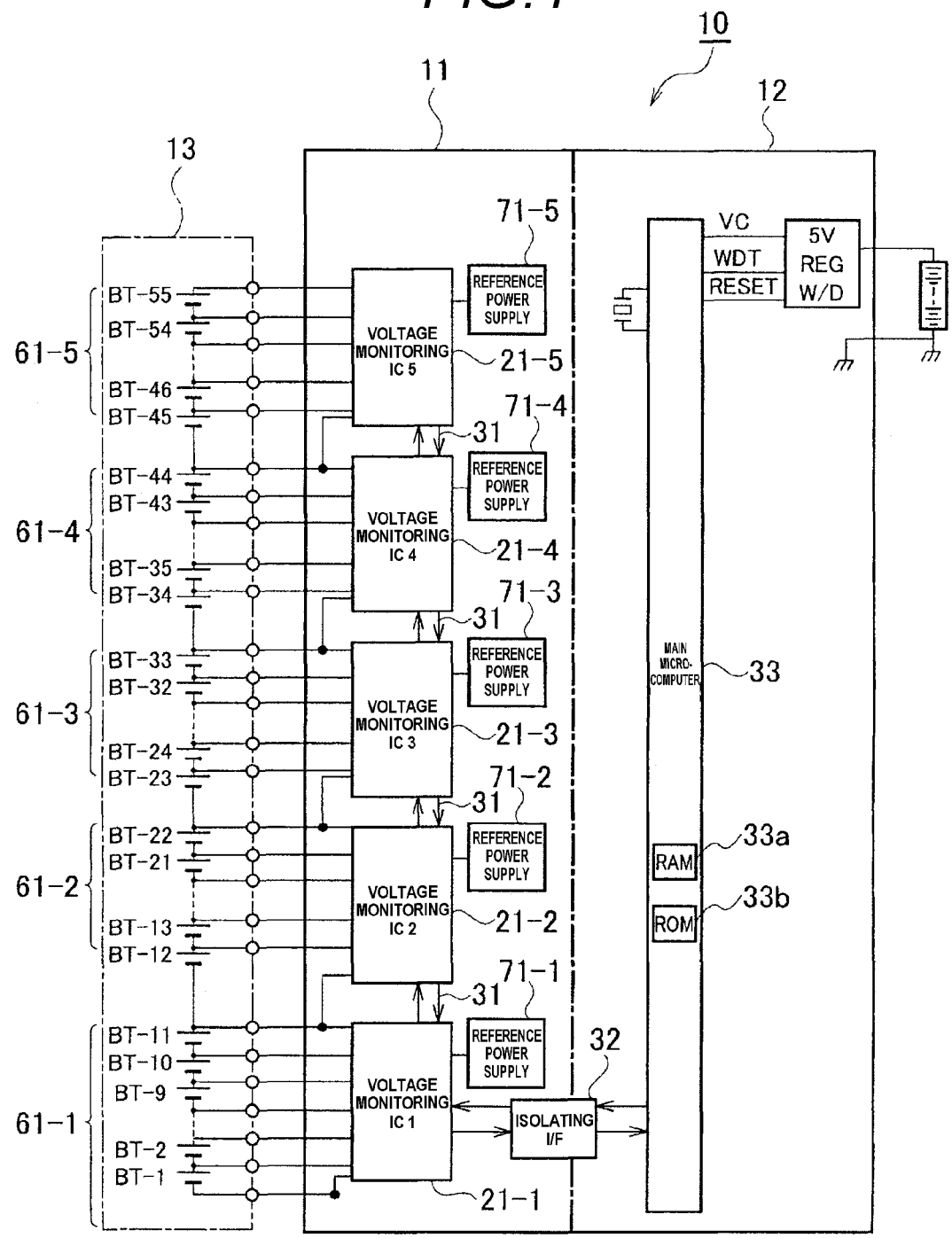
FIG. 1 is a block diagram showing a general electrical configuration of a state monitoring unit for an assembled battery according to an embodiment of the present invention.

There is provided a state monitoring unit for monitoring a state of an assembled battery that outputs a desired voltage, in which a plurality of unit cells are connected in series, the state monitoring unit including: a high voltage side including a plurality of voltage monitoring devices, each device corresponding to respective unit cells among the plurality of unit cells; and a low voltage side electrically isolated with the high voltage side, and including a controller which controls the respective voltage monitoring devices, wherein a common voltage measurement command for instructing a voltage measurement of the unit cells is transmitted from the controller to the respective voltage monitoring devices connected via a communication channel in a daisy-chain scheme, each of the voltage monitoring devices includes: a first transmission unit that transmits, via the communication channel, the common voltage measurement command received from the controller or from one adjacent voltage monitoring device at a leading end side of the communication channel to one adjacent voltage monitoring device at a termination side of the communication channel; a measuring unit that measures the voltage of the corresponding unit cells in response to the received common voltage measurement command; and a second transmission unit that transmits, via the communication channel, the measured voltage corresponding to the own device and a measured voltage received from and corresponding to one adjacent voltage monitoring device at the termination side of the communication channel to the controller or to the adjacent voltage monitoring device at the leading end side of the communication channel, and the controller checks the number of measured voltages of the unit cells received via the communication channel against the number of voltage monitoring devices to determine whether an abnormality occurs in a reception state of the measured voltages of the unit cells.

According to the state monitoring unit of the assembled battery when the voltage measurement command is transmitted from the controller to the communication channel, the voltage measurement command is received by the voltage monitoring device located in the lowest voltage side on the communication channel (i.e., located on the leading end of the communication channel). This voltage monitoring device transmits the received voltage measurement command to the next stage voltage monitoring device adjacent to the termination side of the communication channel. In addition, this voltage monitoring device measures a voltage of the unit cells corresponding to the self-voltage monitoring device in response to the received voltage measurement command.

In addition, the voltage monitoring devices other than the voltage monitoring device located on the leading end of the communication channel receive the voltage measuring command from the previous state voltage monitoring device adjacent to the leading end side of the communication channel. These voltage monitoring devices measure a voltage of the unit cells corresponding to the self-voltage monitoring device in response to the received voltage measurement command. In addition, these voltage monitoring devices transmit the received voltage measurement command to the next stage voltage monitoring devices adjacent to the termination side of the communication channel, except the voltage monitoring device located on the termination side of the communication channel.

In addition, upon receiving the measurement voltage of the corresponding unit cells from the next stage voltage monitoring device adjacent to the termination side of the communication channel, the voltage monitoring devices other than the voltage monitoring device located on the termination side of the communication channel transmit the received voltage measurement voltage to the previous stage voltage monitoring device adjacent to the leading end side of the communication channel or the controller. In addition, when a voltage of the unit cells corresponding to the self-voltage monitoring device is measured, the measured voltage is transmitted to the previous stage voltage monitoring device adjacent to the leading end side of the communication channel or the controller.

Accordingly, simply by transmitting the voltage measurement command once from the controller, a plurality of voltage monitoring devices is allowed to measure a voltage of corresponding unit cells and transmit the measured voltage of the unit cells from respective voltage monitoring devices to the controller.

For this reason, the plurality of voltage monitoring devices proportional to the number of unit cells can smoothly transmit the measured voltage of the corresponding unit cells to the controller without having to transmit individual voltage measurement commands from the controller to respective voltage monitoring devices even without speeding up a daisy chain type communication channel.

In addition, the controller receives data of the measurement voltage of the unit cells having the same number as the voltage monitoring devices located on the communication channel from the voltage monitoring device located on the leading end side of the communication channel. Accordingly, even if the number of received data of the measurement voltage of the unit cells is different from the number of voltage monitoring devices located on the communication channel, it is possible to determine whether or not there is an abnormality in the receipt state of the measurement voltage of the unit cells without using dedicated data for communication abnormality check (data for parity check, etc.). For this reason, the plurality of voltage monitoring devices proportional to the number of unit cells can smoothly transmit the measured voltage of the corresponding unit cells to the controller even without speeding up a daisy chain type communication channel.

The state monitoring unit may be configured in that the controller specifies which of the voltage monitoring devices has measured the voltages of the respective unit cells that the controller has received via the communication channel, based on a receipt order of the measured voltages of the unit cells.

According to the state monitoring unit of the assembled battery, as the voltages of the corresponding unit cells measured by the respective voltage monitoring devices are transmitted in order from the voltage monitoring device located on the termination side of the communication channel to the voltage monitoring device located on the leading end side of the communication channel, the voltages are sequentially transmitted with an alignment corresponding to an arrangement order of voltage monitoring devices on the communication channel.

Accordingly, the controller can specify which of the measurement voltages of the unit cells received from the voltage monitoring device located on the leading end side of the communication channel belongs to which unit cell, by comparing a receipt order of the measurement voltages with an order corresponding to the arrangement order of the voltage monitoring devices on the communication channel.

For this reason, the controller is allowed to determine data of the measurement voltages without adding data identifying the unit cells or the voltage monitoring devices, which have measured the measurement voltages, to the data of the measurement voltages of the unit cells. Accordingly, the voltage monitoring devices can identifiably transmit the measured voltages of the unit cells to the main controller, without excessively increasing the amount of data. For this reason, the plurality of voltage monitoring devices proportional to the number of unit cells can smoothly transmit the measured voltages of the corresponding unit cells to the controller even without speeding up a daisy chain type communication channel.

In addition, it may be configured that the voltage monitoring devices transmit the measurement voltages of the corresponding unit cells received from the voltage monitoring device adjacent to the termination side via the communication channel and the measurement voltages of the unit cells corresponding to themselves to the voltage monitoring device adjacent to the leading end side or the main controller at the same time.

In this case, the voltages of the corresponding unit cells measured by the respective voltage monitoring devices can be collectively transmitted to the controller at one time. Accordingly, other voltage monitoring devices except for the voltage monitoring device located on the termination side of the communication channel do not need to transmit the measurement voltages of the unit cells to the controller in excess by the number of voltage monitoring devices located on the termination side of the communication channel beyond the other voltage monitoring devices. In other words, the respective voltage monitoring devices may transmit data of the measurement voltages of the unit cells at only one time to the voltage monitoring device adjacent to the leading end side of the communication channel or the main controller. Accordingly, the plurality of voltage monitoring devices proportional to the number of unit cells can smoothly transmit the measured voltages of the corresponding unit cells to the controller even without speeding up a daisy chain type communication channel.

Hereinafter, a state monitoring unit for an assembled battery according to an embodiment of the present invention will be described with reference to the drawings.

Embodiment

FIG. 1 is a block diagram showing a general electrical configuration of a state monitoring unit for an assembled battery according to an embodiment of the present invention. In FIG. 1, a state monitoring unit 10 for an assembled battery (hereinafter abbreviated as "state monitoring unit"), serves to control a voltage of a secondary battery 13 (corresponding to an assembled battery) having a plurality of unit cells connected in series, such as a lithium battery or the like. The secondary battery 13 is used as a power supply of a motor M for driving a vehicle (not shown). In this embodiment, the secondary battery 13 is constituted by connecting 55 unit cells BT-1 to BT-55 in series. The secondary battery 13 is used as a high voltage battery for driving a motor used for, for example, a hybrid vehicle or an electric vehicle.

As shown in FIG. 1, the state monitoring unit 10 according to this embodiment is divided into a high voltage side device 11 (corresponding to a high voltage side) and a low voltage side device 12 (corresponding to a low voltage side) with an isolating interface 32 interposed therebetween.

The high voltage side device 11 includes five voltage monitoring ICs, i.e., first to fifth voltage monitoring ICs 21-1 to 21-5 (corresponding to a voltage monitoring device). The first voltage monitoring IC 21-1 measures output voltages of 11 unit cells BT1 to BT11 designated as a first block 61-1. Similarly, the second voltage monitoring IC 21-2 measures output voltages of 11 unit cells BT12 to BT22 designated as a second block 61-2, the third voltage monitoring IC 21-3 measures output voltages of 11 unit cells BT23 to BT33 designated as a third block 61-3, the fourth voltage monitoring IC 21-4 measures output voltages of 11 unit cells BT34 to BT44 designated as a fourth block 61-4, and the fifth voltage monitoring IC 21-5 measures output voltages of 11 unit cells BT45 to BT55 designated as a fifth block 61-5.

In addition, each voltage monitoring IC 21-1 to 21-5 has a respective A/D converter 26 (see FIG. 2) which uses a reference voltage output from each reference power supply 71-1 to 71-5 for A/D conversion to convert a voltage signal measured for each unit cell provided in each block (the first to fifth blocks) into a digital voltage signal.

Additionally, the second to fifth voltage monitoring ICs 21-2 to 21-5 are connected to the first voltage monitoring IC 21-1 via a communication line 31 (corresponding to a communication channel), and the first voltage monitoring IC 21-1 is connected to a main microcomputer 33 (corresponding to a main controller) provided in the low voltage side device 12 via the isolating interface 32. That is, the main microcomputer 33 and each voltage monitoring IC 21-1 to 21-5 are connected via the isolating interface 32 in daisy chain communication by the communication line 31. In addition, a terminator (termination resistance, not shown) is connected to the fifth voltage monitoring IC 21-5 (more specifically, a communication I/F 35a which will be described later) located in the end of the communication line 31.

Figure 2:
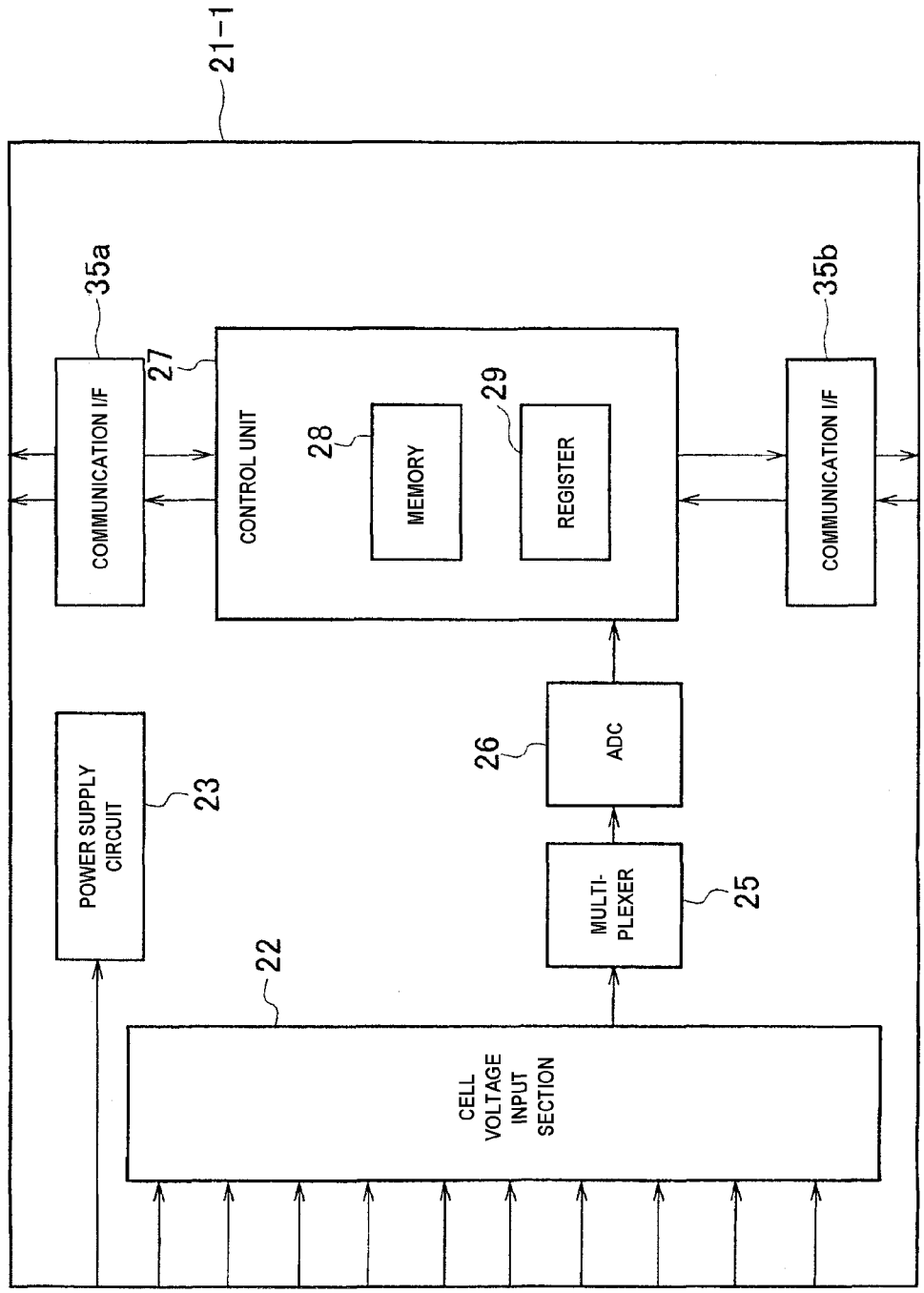
FIG. 2 is a block diagram showing a detailed configuration of a voltage monitoring device of FIG. 1.

FIG. 2 is a block diagram showing an internal configuration of the first voltage monitoring IC 21-1. Hereinafter, the detailed configuration of the first voltage monitoring IC 21-1 will be described with reference to FIG. 2. The second to fifth voltage monitoring ICs 21-2 to 21-5 have the same configuration as that of the first voltage monitoring IC 21-1, and therefore, detailed explanation thereof will be omitted.

As shown in FIG. 2, the first voltage monitoring IC 21-1 includes a power supply circuit 23 which receives power output from the unit cells BT1 to BT11 and generates a predetermined voltage, a cell voltage input section 22 which is connected to the unit cells BT1 to BT11 provided in the block 61-1 and detects output voltages of the unit cells, a multiplexer 25 which converts voltage signals of the unit cells BT1 to BT11 output from the cell voltage input section 22 into a time series of signals, and an A/D converter 26 which converts the voltage signals of the unit cells BT1 to BT11 output from the multiplexer 25 into digital signals. The A/D converter 26 converts an analog signal into a digital signal using a reference voltage output from the reference power supply 71-1.

Additionally, the first voltage monitoring IC 21-1 has a control unit 27 and two communication I/Fs 35a and 35b.

The control unit 27 may be configured by a one-chip microcomputer having a memory 28 and a register 29 for data storage and collectively controls the first voltage monitoring IC 21-1. In addition, upon receiving the output voltages of the unit cells BT1 to BT11 from the A/D converter 26, the control unit 27 stores the received voltages of the unit cells BT1 to BT11 in the memory 28 and performs a process of transmitting the stored output voltages of the unit cells BT1 to BT11 to the main microcomputer 33 shown in FIG. 1 via the communication I/Fs 35a and 35b.

In addition, the second to fifth voltage monitoring ICs 21-2 to 21-5 basically have the same configuration as the first voltage monitoring IC 21-1. However, the unit cells connected to the cell voltage input section 22 and the power supply circuit 23 are the unit cells BT12 to BT22, BT23 to BT33, BT34 to BT44 and BT45 to BT55 corresponding to the second to fifth voltage monitoring ICs 21-2 to 21-5, respectively.

Upon receiving a command from the communication I/F 35b with the control unit 27 as a destination, the control unit 27 of the first to fifth voltage monitoring ICs 21-1 to 21-5 as configured above performs a control for an operation dictated by the command. In addition, upon receiving a command from the communication OF 35b with somewhere other than the control unit 27 as a destination, the control unit 27 outputs the command from the communication I/F 35a. Additionally, the control unit 27 outputs data and the like, which are input from the communication I/F 35a, from the communication I/F 35b.

Figure 3:
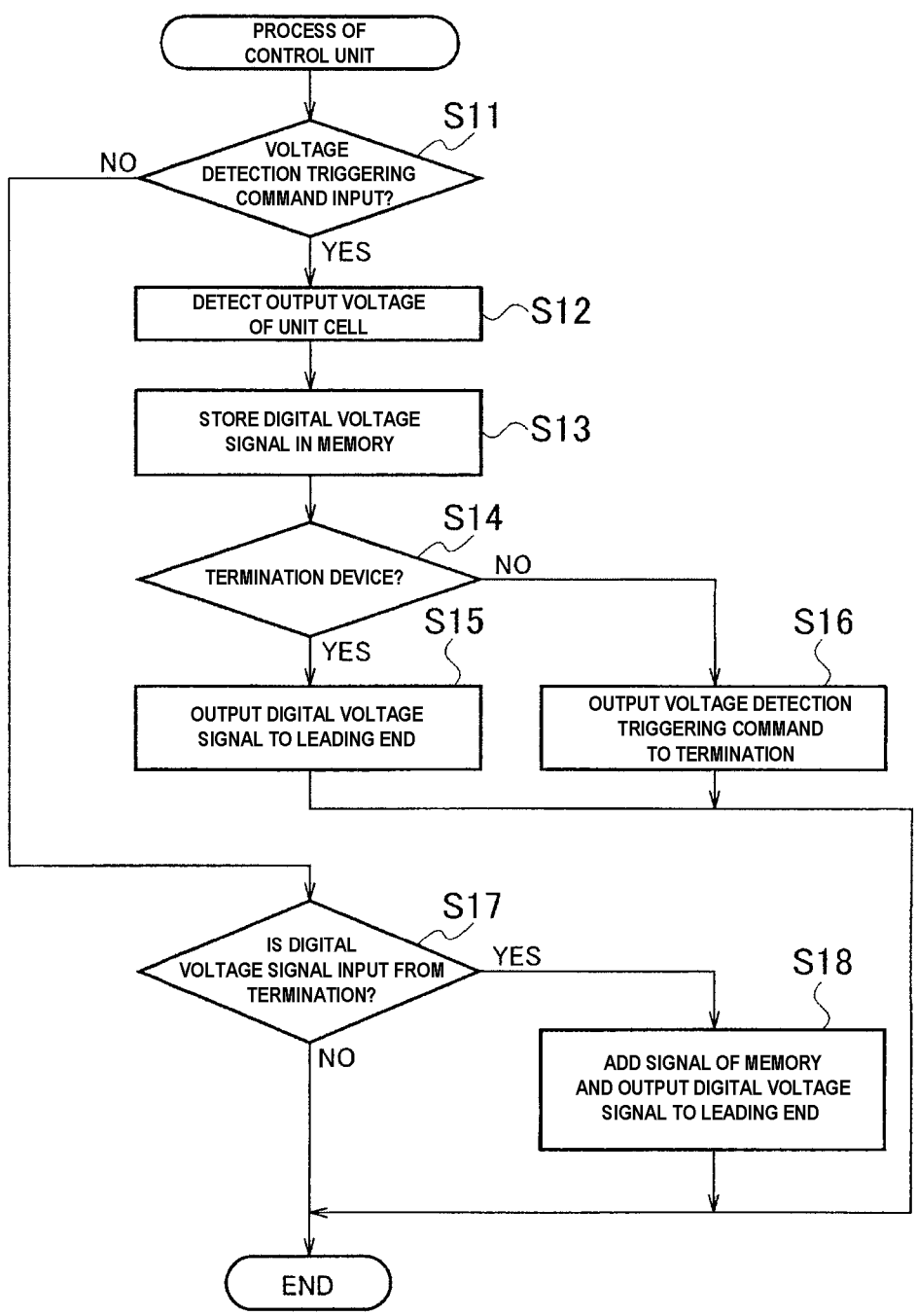
FIG. 3 is a flow chart showing a process performed by a control unit of each voltage monitoring device of FIG. 2.

A main process performed by the control unit 27 of the first to fifth voltage monitoring ICs 21-1 to 21-5, including the above-described control, is as shown in a flow chart of FIG. 3. The process shown in FIG. 3 is repeatedly performed by the control unit 27 of the first to fifth voltage monitoring ICs 21-1 to 21-5.

That is, as shown in FIG. 3, the control unit 27 first checks whether or not a voltage detection triggering command (corresponding to a voltage measurement command) from the main microcomputer 33 (which will be described later) is input from the communication I/F 35b (Step S11). In this embodiment, it is assumed that the voltage detection triggering command includes, in receipt destinations, all of the first to fifth voltage monitoring ICs 21-1 to 21-5. If the command is not input (NO in Step S11), the process proceeds to Step S17 which will be described later.

On the other hand, if the voltage detection triggering command from the main microcomputer 33 is input (YES in Step S11), the control unit 27 controls the cell voltage input section 22 to detect an output voltage of each unit cell BT1 to BT11, BT12 to BT22, BT23 to BT33, BT34 to BT44 and BT45 to BT55 of a connection destination in response to the input voltage detection triggering command (Step S12). Then, the output voltage is converted into a time series of voltage signals of each unit cell BT1 to BT11, BT12 to BT22, BT23 to BT33, BT34 to BT44 and BT45 to BT55 by means of the multiplexer 25, the voltage signal is additionally converted into a digital signal by means of the A/D converter 26, and the digital signal is temporarily stored in the memory 28 (Step S13).

Next, the control unit 27 checks whether or not a self-voltage monitoring IC (the first to fifth voltage monitoring ICs 21-1 to 21-5) is a termination device (the fifth voltage monitoring IC 21-5) on the communication line 31 (Step S14). If the self-voltage monitoring IC is the termination device (i.e., is the fifth voltage monitoring IC 21-5) (YES in Step S14), the digital voltage signal of each unit cell BT45 to BT55 which is temporarily stored in the memory 28 is output from the communication IN 35b to the communication line 31 toward a voltage monitoring IC (the fourth voltage monitoring IC 21-4) to which a leading end on the communication line 31 is adjacent (Step S15). Thereafter, the process is ended. If the self-voltage monitoring IC is not the termination device (i.e., is one of the first to fourth voltage monitoring ICs 21-1 to 21-4) (NO in Step S14), the input voltage detection triggering command is output from the communication I/F 35a to the communication line 31 toward voltage monitoring ICs (the second to fifth voltage monitoring ICs 21-2 to 21-5) to which a termination on the communication line 31 is adjacent (Step S16). Thereafter, the process is ended.

In Step S17, the control unit 27 checks whether or not a digital voltage signal of each unit cell BT12 to BT22, BT23 to BT33, BT34 to BT44 and BT45 to BT55 from the second to fifth voltage monitoring ICs 21-2 to 21-5 to which the termination on the communication line 31 is adjacent is input from the communication I/F 35b. If the digital voltage signal is not input (NO in Step S17), the process is ended.

On the other hand, if the digital voltage signal of each unit cell BT12 to BT22, BT23 to BT33, BT34 to BT44 and BT45 to BT55 is input from the communication IN 35b (YES in Step S17), the digital voltage signal of each unit cell BT1 to BT11, BT12 to BT22, BT23 to BT33 and BT34 to BT44, which is temporarily stored in the memory 28, is added to the input digital voltage signal and is output from the communication I/F 35b to the communication line 31 (Step S18). Thereafter, the process is ended.

As shown in FIG. 1, the main microcomputer 33 contains a RAM 33a in which a work area and so on are provided, and a ROM 33b in which a control program and so on are stored. A main process related to state monitoring of the secondary battery 13, which is performed by the main microcomputer 33 executing the control program stored in the ROM 33b, is as shown in a flow chart of FIG. 4. The process shown in FIG. 4 is repeatedly performed by the main microcomputer 33.

Figure 4:
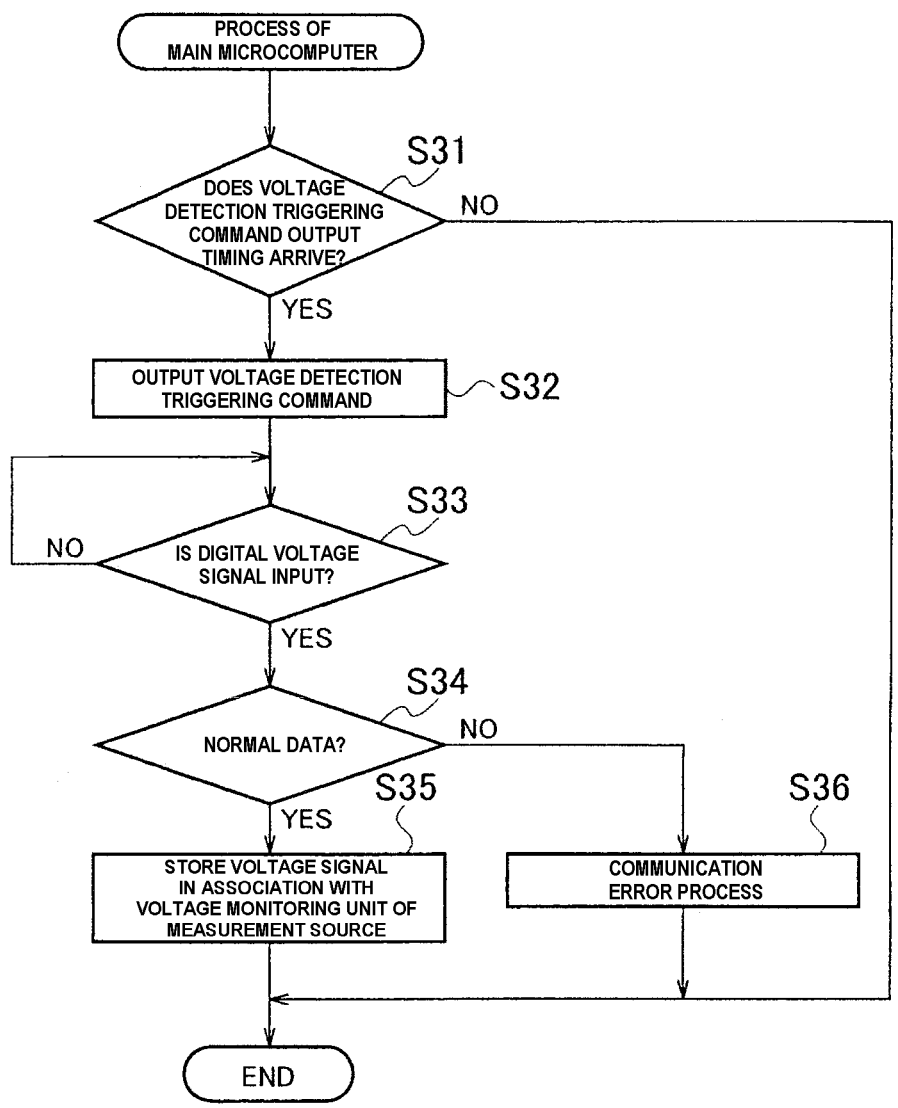
FIG. 4 is a flow chart showing a process performed by a main controller of FIG. 1.

That is, as shown in FIG. 4, the main microcomputer 33 checks whether or not an output timing of the voltage detection triggering command arrives (Step S31). It may be assumed that the output timing of the voltage detection triggering command in the normal mode arrives whenever a predetermined period of time elapses or arrives by a command from an ECU unit side (not shown) located on an upper level of the main microcomputer 33.

If the output timing of the voltage detection triggering command does not arrive (NO in Step S31), the process is ended. If the output timing of the voltage detection triggering command arrives (YES in Step S31), the main microcomputer 33 outputs the voltage detection triggering command to the communication line 31 (Step S32). Then, it is checked whether or not the digital voltage signal of each unit cell BT1 to BT11, BT12 to BT22, BT23 to BT33, BT34 to BT44 and BT45 to BT55 from the first voltage monitoring IC 21-1 which is closest to the main microcomputer 33 on the communication line 31 is input (Step S33).

If the digital voltage signal is not input (NO in Step S33), Step S33 is repeated. If the digital voltage signal is input (YES in Step S33), the main microcomputer 33 checks whether or not data of the input digital voltage signal are normal (Step S34). The normality of data may be checked depending on whether or not the number of digital voltage signals input in Step S33 is equal to the number of first to fifth voltage monitoring ICs 21-1 to 21-5 on the communication line 31.

If data of the input digital voltage signal are normal (YES in Step S34), a measurement voltage of each unit cell BT1 to BT11, BT12 to BT22, BT23 to BT33, BT34 to BT44 and BT45 to BT55, which is represented by the input digital voltage signal, is stored in the RAM 33a in association with the first to fifth voltage monitoring ICs 21-1 to 21-5 which are measurement sources of the measurement voltage (Step S35). Then, the process is ended.

On the other hand, if data of the input digital voltage signal in Step S33 are not normal (NO in Step S34), a predetermined communication error processing step is performed (Step S36) and the process is ended. The communication error processing step may be a step of retrying Step S32 to Step S34 (or Step S35). Alternatively, this step may be a step of informing the ECU unit side (not shown) located on the upper level of the main microcomputer 33 that a communication error occurs. Then, the process is ended.

In the state monitoring unit 10 of this embodiment as configured above, the voltage detection triggering command output by the main microcomputer 33 is first received by the first voltage monitoring IC 21-1 located on the leading end of the communication line 31, thereafter received by the second, third and fourth voltage monitoring ICs 21-2, 21-3 and 21-4 in order, and last received by the fifth voltage monitoring IC 21-5 located on the termination of the communication line 31.

Then, in response to the receipt of the voltage detection triggering command, voltages of the unit cells BT1 to BT11, BT12 to BT22, BT23 to BT33, BT34 to BT44 and BT45 to BT55 to which the voltage monitoring ICs 21-1 to 21-5 correspond respectively are measured. The digital voltage signal obtained by the measurement of the fifth voltage monitoring IC 21-5 located on the termination of the communication line 31 is transmitted to the fourth voltage monitoring IC 21-4.

The fourth voltage monitoring IC 21-4 adds the digital voltage signal of the unit cells BT34 to BT44 obtained by its own measurement to the digital voltage signal of the unit cells BT45 to BT55 received from the fifth voltage monitoring IC 21-5 and transmits a resultant signal to the third voltage monitoring IC 21-3.

Thereafter, the third and second voltage monitoring ICs 21-3 and 21-2 perform the same operation as the fourth voltage monitoring IC 21-4 and, finally, the digital voltage signal of the unit cells BT12 to BT22, BT23 to BT33, BT34 to BT44 and BT45 to BT55 is transmitted to the first voltage monitoring IC 21-1. The first voltage monitoring IC 21-1 adds the digital voltage signal of the unit cells BT1 to BT11 obtained by its own measurement to the digital voltage signal of the unit cells BT12 to BT22, BT23 to BT33, BT34 to BT44 and BT45 to BT55 received from the second voltage monitoring IC 21-2 and transmits a resultant signal to the main controller 33.

Figure 5:
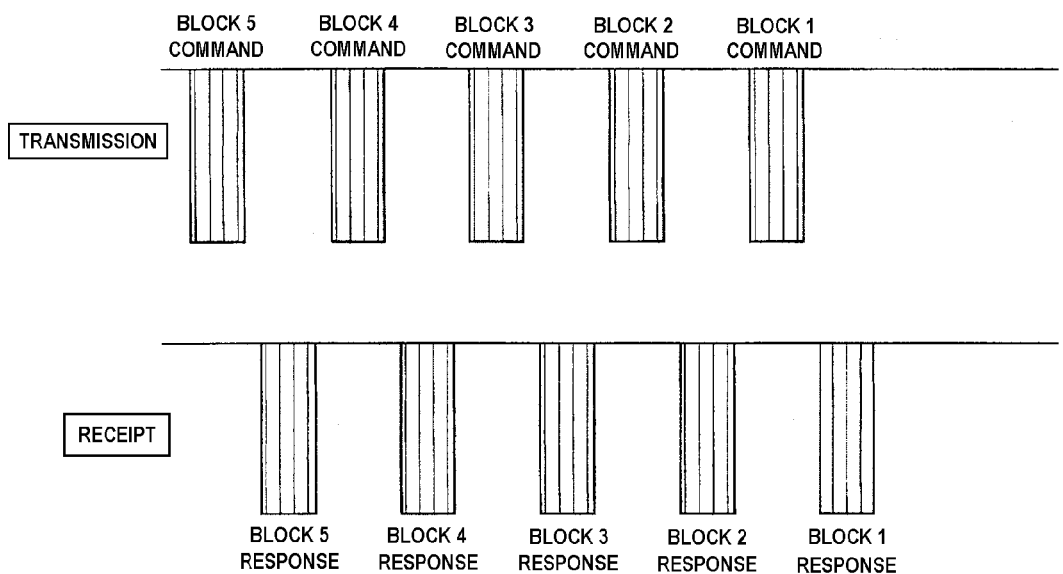
FIG. 5 is a timing chart in a case where the main controller of FIG. 1 outputs a voltage detection triggering command to each voltage monitoring device on a master-slave basis and receives voltage signals of unit cells individually.

If the main controller 33 transmits individual voltage detection triggering commands to the first to fifth voltage monitoring ICs 21-1 to 21-5 and the first to fifth voltage monitoring ICs 21-1 to 21-5 transmit individual digital voltage signals to the main controller 33 on a master-slave basis, data communication shown in a timing chart of FIG. 5 is needed.

Figure 6:
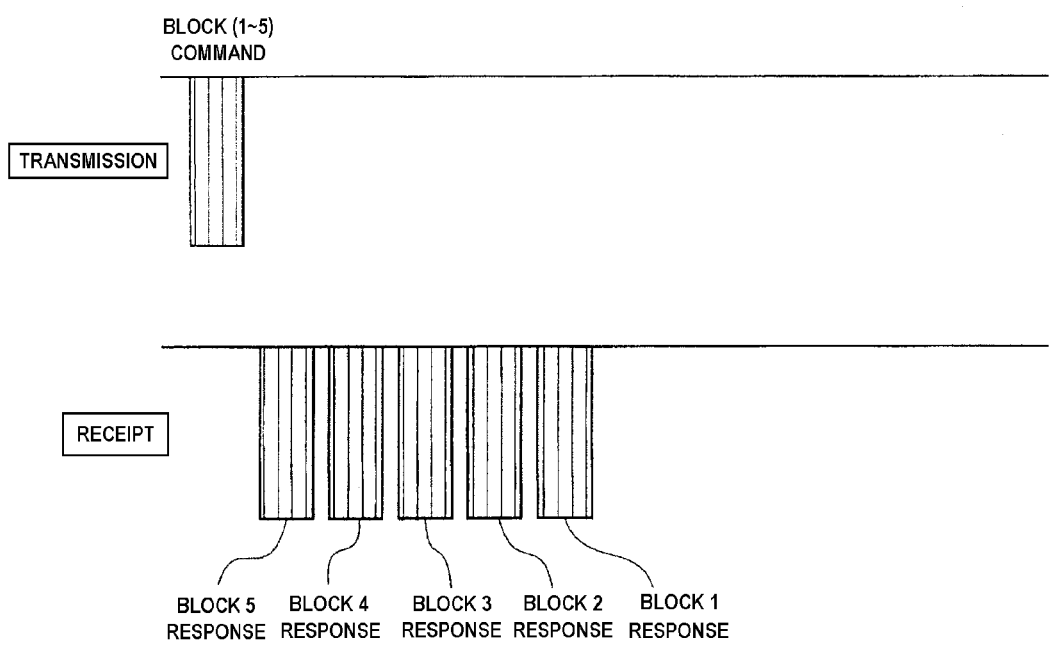
FIG. 6 is a timing chart in a case where the main controller and each voltage monitoring device of FIG. 1 outputs a voltage detection triggering command and receives voltage signals of unit cells by performing the processes shown in FIGS. 3 and 4.

On the other hand, if the main controller 33 transmits the common voltage detection triggering command to the first to fifth voltage monitoring ICs 21-1 to 21-5 individually and the first to fifth voltage monitoring ICs 21-1 to 21-5 transmit the digital voltage signals to the main controller 33 collectively according to the scheme of this embodiment, data communication shown in a timing chart of FIG. 6 is possible.

This enables smooth transmission of the voltage detection triggering command from the main controller 33 to each voltage monitoring IC 21-1 to 21-5 and smooth transmission of the digital voltage signal from the first to fifth voltage monitoring ICs 21-1 to 21-5 to the main controller 33 without using a high speed communication line 31.

In addition, if the number of digital voltage signals of the unit cells BT1 to BT11, BT12 to BT22, BT23 to BT33, BT34 to BT44 and BT45 to BT55 received from the first voltage monitoring IC 21-1 is equal to the number of first to fifth voltage monitoring ICs 21-1 to 21-5 located on the communication line 31, the main microcomputer 33 recognizes data as being received normally. If not equal, data are recognized as being received abnormally.

In addition, the main microcomputer 33 recognizes the digital voltage signal of the unit cells BT1 to BT11, BT12 to BT22, BT23 to BT33, BT34 to BT44 and BT45 to BT55, which is recognized as the normally received data, as the digital voltage signal of the unit cells BT1 to BT11, BT12 to BT22, BT23 to BT33, BT34 to BT44 and BT45 to BT55, which is respectively measured by the voltage monitoring ICs 21-1 to 21-5, based on an arrangement order of the first to fifth voltage monitoring ICs 21-1 to 21-5 located on the communication line 31. Then, the digital voltage signals are stored in the RAM 33a in association with the voltage monitoring ICs 21-1 to 21-5 of the measurement sources.

Accordingly, for example, the ECU unit (not shown) located on the upper level of the main microcomputer 33 is allowed to precisely determine the state of the secondary battery 13 using the measurement voltage of each unit cell BT1 to BT11, BT12 to BT22, BT23 to BT33, BT34 to BT44 and BT45 to BT55, which is represented by the received digital voltage signal.

In addition, the above-described embodiment is configured such that, when the digital voltage signal of each unit cell BT12 to BT22, BT23 to BT33, BT34 to BT44 and BT45 to BT55 is input from the second to fifth voltage monitoring ICs 21-2 to 21-5 to which the termination on the communication line 31 is adjacent, the control unit 27 of the first to fourth voltage monitoring ICs 21-1 to 21-4 adds the digital voltage signal of each unit cell BT1 to BT11, BT12 to BT22, BT23 to BT33 and BT34 to BT44, which is measured in the control unit 27, to the input digital voltage signal and outputs a resultant signal to the first to fourth voltage monitoring ICs 21-1 to 21-4 to which the leading end on the communication line 31 is adjacent.

However, when each of the first to fifth voltage monitoring ICs 21-1 to 21-5 measures the voltage of each unit cell BT1 to BT11, BT12 to BT22, BT23 to BT33, BT34 to BT44 and BT45 to BT55 in response to the input of the voltage detection triggering command, a digital voltage signal indicating the measured voltage may be individually output to the main microcomputer 33 via the different first to fourth voltage monitoring ICs 21-1 to 21-4 which are located in the leading end on the communication line 31.

Even in such a configuration, it is possible to reduce the amount of data related to transmission of the voltage detection triggering command from the main controller 33 to each voltage monitoring IC 21-1 to 21-5, thereby allowing smooth data communication.

Further, even in such a configuration, the main microcomputer 33 can determine whether or not data are received normally depending on whether or not the number of digital voltage signals of the unit cells BT1 to BT11, BT12 to BT22, BT23 to BT33, BT34 to BT44 and BT45 to BT55, which are received from the first voltage monitoring ICs 21-1, is equal to the number of first to fifth voltage monitoring ICs 21-1 to 21-5 located on the communication line 31.

Additionally, the main microcomputer 33 can recognize the digital voltage signal of the unit cells BT1 to BT11, BT12 to BT22, BT23 to BT33, BT34 to BT44 and BT45 to BT55, which is recognized as the normally received data, as the digital voltage signal of the unit cells BT1 to BT11, BT12 to BT22, BT23 to BT33, BT34 to BT44 and BT45 to BT55, which is respectively measured by the voltage monitoring ICs 21-1 to 21-5, based on an arrangement order of the first to fifth voltage monitoring ICs 21-1 to 21-5 located on the communication line 31.

The present invention is very useful when a cell voltage of an assembled battery constituting a high voltage battery is measured in a high voltage side according to a control of a low voltage side.

What is claimed is:

1. A state monitoring unit for monitoring a state of an assembled battery that outputs a desired voltage, in which a plurality of unit cells are connected in series, the state monitoring unit comprising:

a high voltage side including a plurality of voltage monitoring devices, each device corresponding to respective unit cells among the plurality of unit cells; and a low voltage side electrically isolated with the high voltage side, and including a controller which controls the respective voltage monitoring devices, wherein a common voltage measurement command for instructing a voltage measurement of the unit cells is transmitted from the controller to the respective voltage monitoring devices connected via a communication channel in a daisy-chain scheme, each of the voltage monitoring devices includes:

a first transmission unit that transmits, via the communication channel, the common voltage measurement command received from the controller or from one adjacent voltage monitoring device at a leading end side of the communication channel to one adjacent voltage monitoring device at a termination side of the communication channel;

a measuring unit that measures the voltage of the corresponding unit cells in response to the received common voltage measurement command; and a second transmission unit that transmits, via the communication channel, the voltage measured by the associated measuring unit and a measured voltage received from and corresponding to one adjacent voltage monitoring device at the termination side of the communication channel to the controller or to the adjacent voltage monitoring device at the leading end side of the communication channel, and the controller checks the number of measured voltages of the unit cells received via the communication channel against the number of voltage monitoring devices to determine whether an abnormality occurs in a reception state of the measured voltages of the unit cells.

2. The state monitoring unit according to claim 1, wherein the controller specifies which of the voltage monitoring devices has measured the voltages of the respective unit cells that the controller has received via the communication channel, based on a receipt order of the measured voltages of the unit cells.

* * * * *